United States Patent [19]

Ogawa

[11] Patent Number: 5,855,679
[45] Date of Patent: Jan. 5, 1999

[54] SEMICONDUCTOR MANUFACTURING APPARATUS

[75] Inventor: Takashi Ogawa, Tokyo, Japan

[73] Assignee: NEC Corporation, Tokyo, Japan

[21] Appl. No.: 621,205

[22] Filed: Mar. 21, 1996

[30] Foreign Application Priority Data

Mar. 30, 1995 [JP] Japan .................................. 7-072932

[51] Int. Cl.⁶ .................................................. C23C 16/00
[52] U.S. Cl. ............................ 118/719; 118/723; 156/345
[58] Field of Search ................................ 118/719, 723 E; 156/345; 204/298.11

[56] References Cited

U.S. PATENT DOCUMENTS

| | | | |
|---|---|---|---|
| 4,824,545 | 4/1989 | Arnold et al. | 204/298.25 |
| 4,895,107 | 1/1990 | Yano et al. | 118/722 |
| 5,174,881 | 12/1992 | Iwasaki et al. | 204/298.25 |
| 5,382,339 | 1/1995 | Aranovich et al. | 204/192.12 |
| 5,449,410 | 9/1995 | Chang et al. | 118/723 ER |
| 5,624,536 | 4/1997 | Wada et al. | 204/298.11 |
| 5,650,013 | 7/1997 | Yamazaki | 118/723 MP |
| 5,651,867 | 7/1997 | Kokaku et al. | 204/298.25 |

FOREIGN PATENT DOCUMENTS 1-103828   4/1989   Japan .................................. 118/723 E
4-360523  12/1992   Japan .

OTHER PUBLICATIONS

Zider, R. E., Semicontinuous Evaporation System, IBM Technical Disclosure Bulletin, vol. 14 No. 4, pp. 1199 and 1200, Sep. 1971.

*Primary Examiner*—Bruce Breneman
*Assistant Examiner*—Jeffrie R. Lund
*Attorney, Agent, or Firm*—Sughrue, Mion, Zinn, Macpeak & Seas, PLLC

[57] ABSTRACT

A semiconductor manufacturing apparatus which enables, inside a vacuum, the transport of and mounting at a prescribed position of a supporting component or processing component, such as a susceptor or a shower head is provided. An electrode exchanging chamber 31, inside of which a vacuum can be generated, is provided adjacent to a process chamber 30 via a gate valve 8, an electrode up/down elevator pin 22 is provided inside the process chamber 30 for transporting a susceptor 1 or a shower head 2 to a prescribed height, and clamping mechanism 40 and 41, which hold a susceptor 1 or a shower head 2 with a prescribed torque from outside the process chamber 30.

36 Claims, 10 Drawing Sheets

RELATIONSHIP OF SUSCEPTOR AND HEATER CONTACT SURFACE AREA TO NUMBER OF SUCCESSIVE SUSCEPTOR EXCHANGES

Fig. 6(B)

RELATIONSHIP OF SUSCEPTOR SURFACE TEMPERATURE TO NUMBER OF SUCCESSIVE SUSCEPTOR EXCHANGES

SEMICONDUCTOR MANUFACTURING APPARATUS

BACKGROUND OF THE INVENTION

1. Field of the Invention

The present invention relates to a semiconductor manufacturing apparatus, and more specifically it relates to a part-exchanging mechanism in an apparatus which processes a semiconductor wafer within a hermetically sealed space.

2. Description of the Related Art

In the past, many methods and apparatuses have been known as methods of manufacturing semiconductors by processing a semiconductor wafer in a hermetically sealed space in accordance with a prescribed method.

Known methods include performing, for example, epitaxial growth with respect to a semiconductor wafer, the method of performing vapor deposition onto a semiconductor wafer, and the method of performing dry etching or plasma CVD processing of a semiconductor wafer.

In performing any of theses types of processing on a semiconductor wafer, because the prescribed processing is performed in a hermetically sealed space, in addition to it being necessary to transport the semiconductor wafer into the above-noted hermetically sealed processing space and to transport a semiconductor wafer which has been processed out from the hermetically sealed processing space, supporting components provided inside the hermetically sealed processing space and which hold or support the semiconductor wafer which is being processed, and processing components such as electrodes or shower plates and the like provided in this space for the purpose of performing the prescribed processing on the above-noted semiconductor wafer can deteriorate during this processing, accumulate impurities or be otherwise contaminated, so that they do not function in the manner that they should, this resulting in the need to replace either the supporting components or the processing components or both each time a prescribed amount of processing time has elapsed.

However, because the above-noted processing of the semiconductor wafer is carried out in a hermetically sealed processing space, it is necessary to perform these exchanging operations in a manner that does not disturb the hermetically sealed condition, this not only requiring a complex mechanism, but also a complex exchanging operation.

For example, taking the example of a semiconductor manufacturing apparatus which processes a semiconductor wafer using the plasma CVD processing method, the above-noted problem can be described specifically as follows.

Specifically, when performing plasma CVD processing of a semiconductor wafer, a widely used method is to form an insulating film on the semiconductor wafer by performing plasma CVD processing using a gas such as TEOS, SiH4, O2 or the like.

A chamber which is used in plasma CVD processing can be of the single-wafer type or the batch type, and because of the difficult of controlling the process parameters for each individual semiconductor wafer in a batch-type chamber, with semiconductor wafer sizes growing in the future, it is thought that the single-wafer type will become the main type used.

Figure 11:
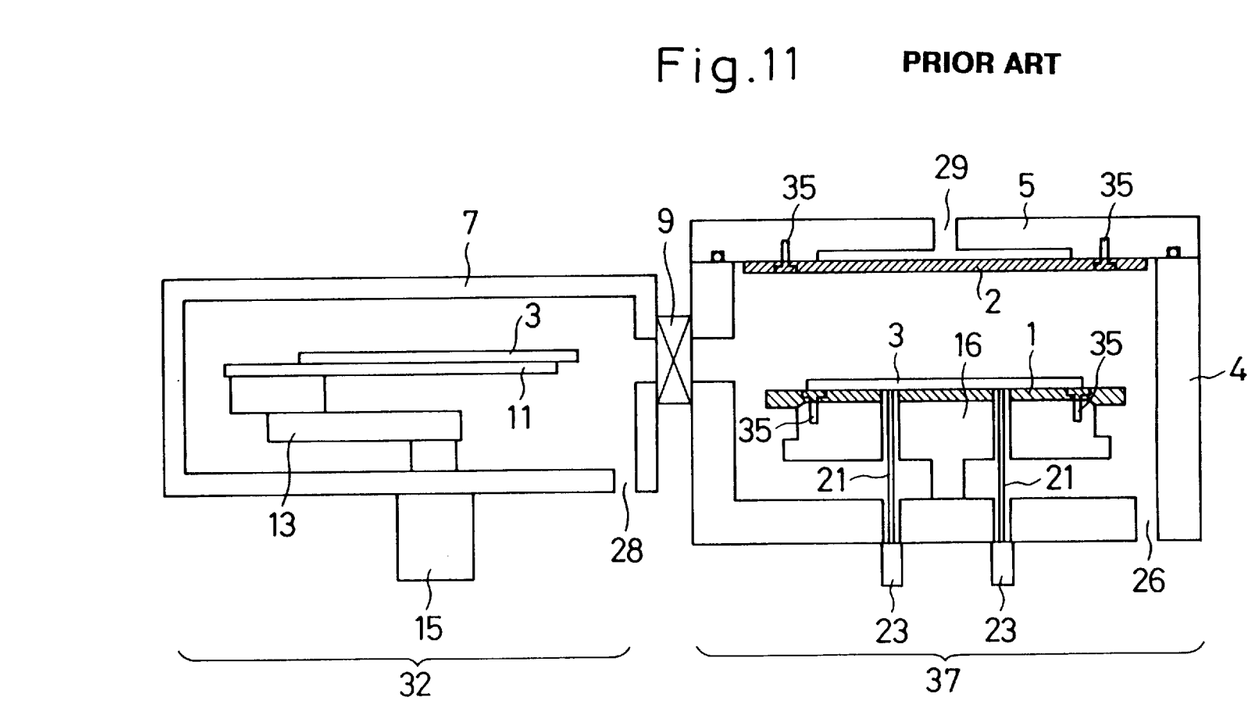
FIG. 11 is a cross-sectional view which shows a conventional single-wafer type plasma CVD apparatus.

FIG. 11 is a cross-sectional view which shows an example of a conventional single-wafer type plasma CVD apparatus. As shown in FIG. 11, this single-wafer plasma CVD apparatus is formed from a process chamber 37, which has a process chamber body 4 and process chamber cover 5, and a wafer transport chamber 32, the above-noted process chamber 37 and transport chamber 32 being separated by a gate valve 9.

Inside the wafer transport chamber 32, which is hermetically sealed by the wafer transport chamber outer wall 7, a wafer transport robot 13, is driven by a wafer transport robot drive section 15, is provided, and inside the process chamber 37, a wafer-heating heater block 16, with a built-in heater, wafer position adjusting up/down elevator pins 21, a susceptor 1, and a shower head 2 are provided, the susceptor 1 and shower head 2 being held at the prescribed position by bolts 35.

The operation of the above-noted apparatus described as follows.

The semiconductor wafer 3 is rested on a fork 11 of the wafer transport robot 13, and a vacuum is generated in the wafer transport 32 via the wafer transport chamber exhaust port 28. After the wafer transport chamber 32 reaches the same pressure as the process chamber 37, in which a vacuum is generated via the process chamber exhaust port 26, the gate valve 9 is opened. The fork 11 of the wafer transport robot 13 extends in the direction of the process chamber 37, and the semiconductor wafer 3 is transported to inside the process chamber 37.

When this is done, the up/down elevator pin drive section 23 causes the wafer position adjusting up/down elevator pins 21 to slide upward, the wafer transport robot 13 rests the semiconductor wafer 3 onto the pins, and then returns into the wafer transport chamber 32. Then, the gate valve 9 closes, the wafer position adjusting up/down elevator pins 21 slide downward, and the semiconductor wafer 3 is rested onto the susceptor 1. Next, process gas is led into the process chamber 37 via a large number of holes in the shower head 2 from the gas inlet 29, and a high-frequency output voltage is applied between the susceptor 1 and the shower head 2, thereby forming an insulation film on the semiconductor wafer 3. After the growth is completed, the semiconductor wafer 3 is transported out of the process chamber 37 in a sequence that is the reverse of the one followed when it was transported thereinto.

In addition, after feeding cleaning gas by passing it through many holes in the shower head 2, a high-frequency output voltage is applied between the susceptor 1 and the shower head 2, to remove the film that grew inside the process chamber 37.

In a conventional single-wafer type CVD apparatus as described above, the exchange of a deteriorated susceptor and shower head are performed by returning the process chamber to atmospheric pressure and lowering the temperature of the heater block, after which the chamber cover 5 is opened, and the bolts 35 which hold the susceptor 1 and shower head 2 are removed. However, this operation exposes the inner walls of the process chamber to the oxygen and moisture components contained in the air. The oxygen and moisture components react with residual gas that has become adsorbed into the inner walls of the process chamber. Additionally, the oxygen and moisture components themselves are adsorbed into the inner walls of the process chamber.

Furthermore, by reducing the temperature of the heater 16, the inside of the process chamber is exposed to a large temperature change, resulting in a flaking of material which has formed on the inner walls of the process chamber due to a difference in thermal shrinkage rate. These phenomena cause the generation of particles and a change in film properties. At present, the inside walls of the chamber are wiped with ethanol as a countermeasure, but not only is this task very troublesome, but also there is the problem of not being able to completely remove generated particles or oxygen and moisture components which have become attached to the inner walls of the chamber.

In the CVD method as applied to chemical semiconductors such as GaAs, there is a method, as disclosed in Japanese Unexamined Patent Publication H4-360523, a chamber in which a susceptor is mounted is provide at the bottom part of the process chamber, the susceptor and the bottom surface of the chamber, known as a skirt, being exchanged in a vacuum. However, the application of this method to a single-wafer type CVD apparatus causes the construction of the bottom part of the susceptor to become complex, and also causes the problem of lack of space to provide a chamber into which the susceptor is mounted. Even if space can be obtained for providing the chamber into which the susceptor is mounted, a problem to be described below prevents exchange in a clean condition.

In the conventional single-wafer plasma CVD apparatus, once when the susceptor was exchanged, surface temperature of the susceptor is necessarily varied, even when it is controlled so that the temperature of the heater block after the exchange operation was carried out, is set at temperature identical to that before the exchange operation was carried out.

This fact is based upon a phenomena in that an amount of thermal transmission from the heater block to the susceptor, will be changed due to a variation in an area of contacting phase formed between the susceptor made of aluminum and the heater block made of aluminum.

The susceptor and heater contact surface area is influenced by non-uniformities in the bottom surface of the susceptor and the contact load between the susceptor and the heater. Because of the non-uniformity in the bottom surface of the susceptor, which differs for each susceptor, to limit the surface temperature variation of the susceptor, it is necessary to cause the susceptor to make pressurized contact with the heater block with a fixed force. However, in the past, because the method of doing this, as shown in FIG. 11, was by means of the bolt tightening from the inside, it was not possible to cause a pressurized contact in a vacuum condition. That is, from the technology in the Unexamined Patent Application Publication H4-360523, because it is only possible to transport the susceptor to the process chamber in a vacuum, heretofore it was not possible either remove the susceptor which was held by a tightened bolt or to achieve a pressurized contact of the susceptor on the top of the heater block. Also, because the shower head which was mounted to the bottom surface of cover was also held by a bolt from the inside, it was not possible to apply the above-noted technology, of the past, in which only transport is done in a vacuum, to a single-wafer type plasma CVD apparatus. That is, even if the above-noted technology of the past were to be applied to a single-wafer type plasma CVD apparatus, after transporting the susceptor or the shower head in a vacuum, because it is necessary to return to atmospheric pressure to perform the required mounting, the result is that the above-noted problems of residual gases with regard to oxygen and moisture components, and with regard to flaking of material which has formed on the inner walls of the chamber are not solved.

SUMMARY OF THE INVENTION

It is an object of the present invention to provide an improved semiconductor manufacturing apparatus such as a CVD processing apparatus.

It is another object of the present invention to provide a CVD apparatus for fabricating a semiconductor device, in which at least one of a wafer susceptor and an electrode can be exchanged without braking a vacuum condition of a process chamber.

Still another object of the present invention is to provide a semiconductor manufacturing apparatus in which all the transport and mounting of semiconductor wafer supporting components which need to be exchanged, such as a susceptor, and all the transport and mounting of processing components for executing the prescribed processing with respect to a semiconductor wafer supported by above-noted supporting components, and which need to be exchanged, such as electrodes, shower heads and the like, are performed in a hermetically sealed processing space known as a chamber, which is maintained under prescribed atmospheric conditions, these conditions including the vacuum condition, thereby eliminating the problem as described above of exposing the inside of the hermetically sealed processing space to the atmosphere when performing exchange of the above-noted supporting components or processing components.

Therefore, to achieve the above-noted object, a semiconductor manufacturing apparatus according to the present invention basically adopts the following type of technical constitution. Specifically, it is a semiconductor manufacturing apparatus which performs processing of a semiconductor wafer in a hermetically sealed processing space, and which includes a component transport in/out mechanism, by which at least one semiconductor wafer supporting component, such as a susceptor, or at least one processing component for executing the prescribed processing with respect to a semiconductor wafer supported by above-noted supporting component, such as electrodes, shower heads and the like are transported into the above-noted hermetically sealed processing space or out from the above-noted hermetically sealed processing space without disturbing the hermetically sealed condition of the above-noted hermetically sealed processing space, and which further is provided with a clamping mechanism in the above-noted hermetically sealed processing space which, responsive to operations from outside the above-noted hermetically sealed processing space, either holds the above-noted supporting component or above-noted processing component in a prescribed position within the above-noted hermetically sealed processing space or releases the hold thereon at a prescribed position, without disturbing the hermetically sealed condition inside the above-noted hermetically sealed processing space.

In addition, another aspect of a semiconductor manufacturing apparatus according to the present invention is a semiconductor manufacturing apparatus which performs processing of a semiconductor wafer which has been transported into a hermetically sealed processing space, and which includes a component transport in/out mechanism, by which at least one semiconductor wafer supporting component, such as a susceptor, or at least one processing component for executing the prescribed processing with respect to a semiconductor wafer supported by above-noted supporting component, such as electrodes, shower heads and the like are transported into the above-noted hermetically sealed processing space or out from the above-noted hermetically sealed processing space without disturbing the hermetically sealed condition of the above-noted hermetically sealed processing space, and which further is provided with a position adjusting means in the above-noted hermetically sealed processing space that can be driven upward and downward for the purpose of adjusting, responsive to operations from outside the above-noted hermetically sealed processing space, the horizontal position of the above-noted supporting component or above-noted processing component without disturbing the hermetically sealed condition inside the above-noted hermetically sealed processing space.

That is, a semiconductor manufacturing apparatus according to the present invention has the above-noted technical constitution, by virtue of which a clamping mechanism is provided in the hermetically sealed processing space which either holds the above-noted supporting component or processing component at a prescribed position, or releases the above-noted supporting component or processing component at a prescribed position, this clamping mechanism being operable from outside the hermetically sealed processing space, enabling the mounting and removal of the above-noted supporting component or processing component on or from the prescribed position without disturbing the hermetically sealed condition of the above-noted hermetically sealed processing space.

BRIEF DESCRIPTION OF THE DRAWINGS

The above and other objects, advantages and features of the present invention will be more apparent from the following description taken in conjunction with the accompanying drawings, wherein.

DETAILED DESCRIPTION OF THE INVENTION

Figure 1:
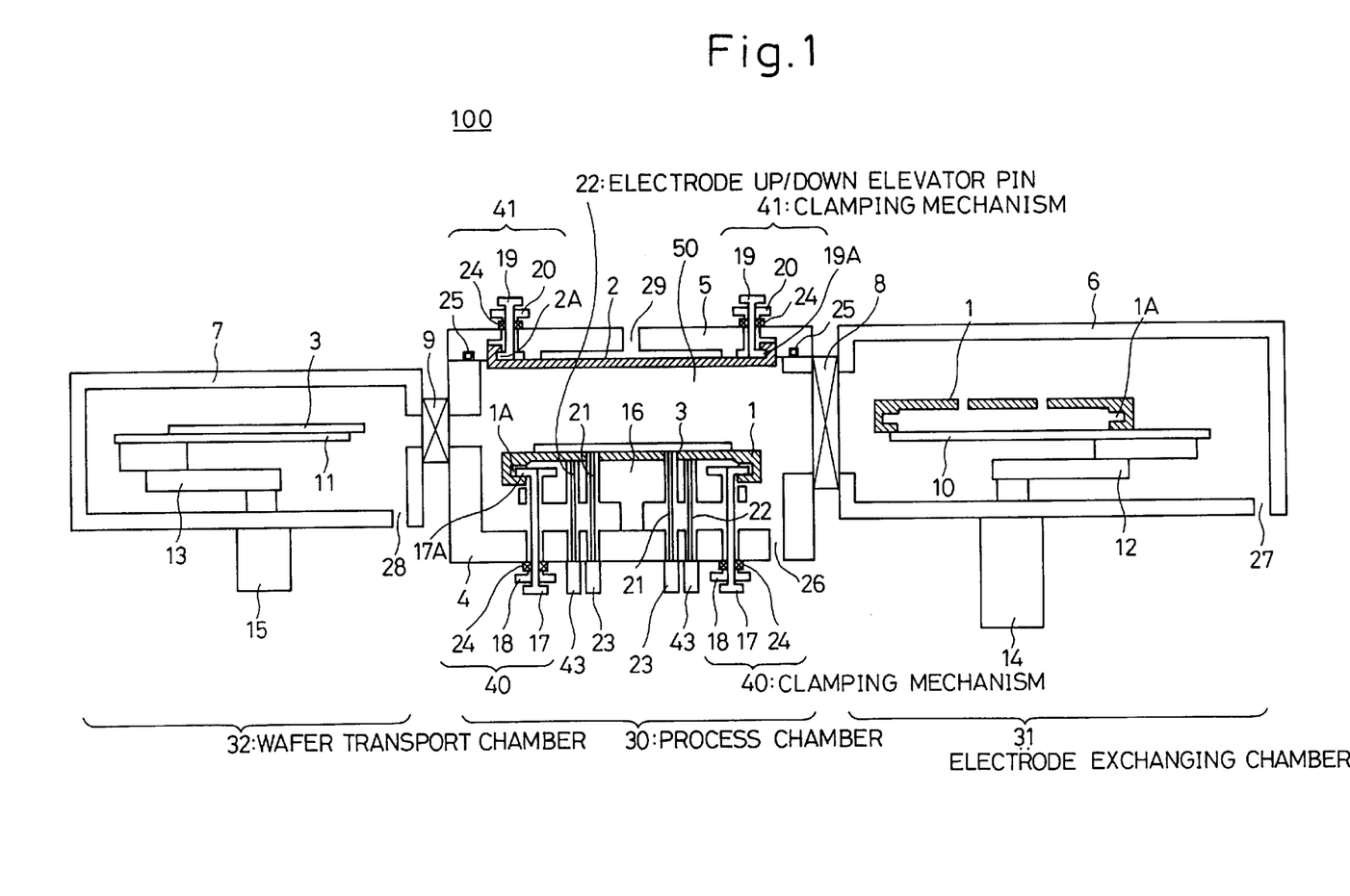
FIG. 1 is a cross-sectional view of a single-wafer type plasma CVD apparatus representing an embodiment of the present invention.

Referring now to FIG. 1, a semiconductor manufacturing apparatus according to the embodiment of the present invention is constructed as a plasma etching apparatus 100 of a singe-wafer type, in which the same constituents as those shown in FIG. 11 are denoted by the same reference numerals to omit further description thereof. This apparatus 100 includes a wafer transport chamber 32 and a process chamber 30 having a hermetically sealed processing space 50 in which processing of a semiconductor wafer 3 is performed therein. The apparatus 100 further includes an electrode exchanging chamber 31 as a component transport in/out mechanism 12 in accordance with the present invention, by which a wafer susceptor 1 as a semiconductor wafer supporting component and a shower head electrode 2 as a processing component are transported into and out of from the hermetically sealed processing space 50 without disturbing the hermetically sealed condition of the hermetically sealed processing space 50.

In accordance further with the present invention, there are provided clamping mechanisms 40 and 41 in the hermetically sealed processing space 50, which hold or clamp the susceptor 1 and the electrodes 2 to a chamber cover 5 and a heater block 16, respectively.

In order to exchange the susceptor 1 and the electrodes 2 with new ones, further more, a position adjusting means 43 is provided in the hermetically sealed processing space 50. This means 43 can be driven upward and downward for the purpose of adjusting the horizontal position of the susceptor 1 and the electrodes 2. The electrode exchanging chamber 31 is coupled to the process chamber 30 by a gate 8.

It is to be noted that the present can also be applied to the epitaxial growth method, the vapor deposition method, or the dry etching or plasma CVD method.

Figure 9:
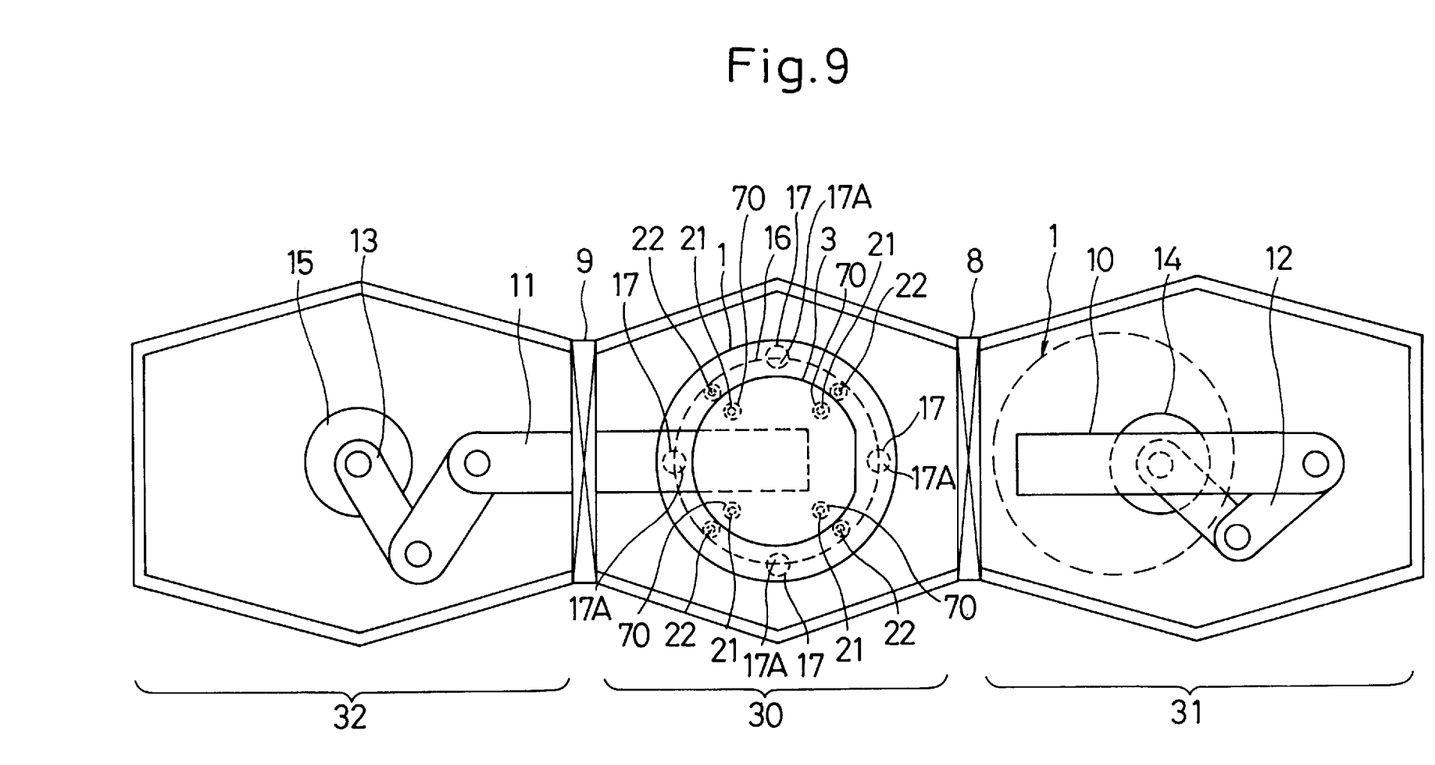
FIG. 9 is a plan view illustrative of a part of a semiconductor manufacturing apparatus according to the present invention as shown in FIG. 1.

Describing in more detail with reference to FIG. 1 and FIG. 9 which show a plan view of the apparatus 100 shown in FIG. 1, the wafer transport chamber 32 and the process chamber 30 are disposed longitudinally with a vacuum gate valve 9, and the process chamber 30 and the electrode exchanging chamber 31 are disposed longitudinally with a vacuum valve 8 between them.

The wafer transport chamber 32, similarly to the case shown in FIG. 11 has the wafer transport chamber outer wall 7, an inside part of which is brought into a vacuum condition by means of an exhaust system (not shown in the drawing) via an exhaust port 28 provided in the wafer transport chamber 32. This inside part has provided in it a wafer transport robot 13, which is driven by a wafer transport robot drive section 15, so that, in the vacuum, the semiconductor wafer 3 is rested onto the fork 11 of the wafer transport robot 13, is transported through the opened gate valve 9 into the vacuum of the process chamber 30, and is processed by prescribed processing with the gate valve 9 in the closed condition, after which processing the semiconductor wafer 3 is rested onto the fork 11 and transported through the opened gate valve 9 to return it to the wafer transport chamber 32.

The process chamber 30 of the present invention is separated, by means of the gate valve 9 and the gate valve 8, from the wafer transport chamber 32 and a component exchanging chamber 31 for either a supporting component or an electrode which is one of a processing components, respectively, a vacuum being generated in the inside space 50 which is hermetically sealed by the outer wall 4 forming a main body of the process chamber 30 and the contact of the process chamber cover 5 therewith, via an O-ring 25, via the process chamber exhaust port 26 by means of an exhaust system (not shown in the drawing). In this inner space 50 are a susceptor 1, which forms the bottom electrode onto which the semiconductor wafer 3 is rested, a wafer heating heater block 16 having an internal heater which makes contact with the susceptor 1 and heats the semiconductor wafer 3, and a shower head 2 of the upper electrode, which disperses gas which is fed from the gas inlet 29 over the top of the semiconductor wafer 3.

The susceptor 1 of the present invention has formed around the side thereof which makes contact with the heater block 16, that is around the bottom side thereof, a U-shaped formation 1A, into which a protrusion 17A of a susceptor clamp 17 fits. This susceptor clamp 17 is led to the outside, via a vacuum seal 24, through the body 4 which forms the outer walls, at which point it is linked to a susceptor tightening handle 18 to form the susceptor clamping mechanism 40, the susceptor 1 being held against the heater block 16 with the prescribed amount of torque. The susceptor clamping mechanism 40 will be described later, making reference to FIG. 3.

In the same manner, the shower head 2 has formed around the side opposite the side which faces the semiconductor wafer a U-shaped formation 2A, into which a protrusion 19A of a shower head clamp 19 fits. This shower head clamp 19 is led to the outside, via a vacuum seal 24, through the cover 5 which forms the outer wall, at which point it is linked to a shower head tightening handle 20 to form the shower head clamping mechanism 41, the shower head 2 being held against the cover 5 with the prescribed amount of torque. The shower head clamping mechanism 41 will be described later, making reference to FIG. 3. An example of the vacuum seal 24 is shown in FIG. 3(B). In more detail, protrusions 241 and 242 are formed on the inner wall of pin passage hole in either the body 4 or the cover 5, a sealing element is made of an elastic material 243 such as rubber and a metallic spring leaf 244 being is laminated and this is bent so as to be inserted into the U-shaped formation in the space between the protrusions 241 and 242.

Additionally, in the present invention separate from the wafer transport up/down elevator pins 21 which are linked to the wafer transport up/down elevator pin drive section 23 and which cause the semiconductor wafer 3 to rise and fall, electrode up/down elevator pins 22 are provided so as to pass through the heater block 16, these being driven up and down by an electrode up/down elevator pin drive section 43, and transporting a susceptor or a shower head to be mounted or removed at a prescribed height.

The electrode exchanging chamber 31 is separated from the process chamber 30 by means of the gate valve 8, the inside of this electrode exchanging chamber 31, which is surrounded by the electrode exchanging chamber outer wall 6, having a vacuum generated in it via the electrode exchange chamber exhaust port 27 by means of an exhaust system (not shown in the drawing). Inside this chamber, an electrode transport robot 12, which is driven by an electrode transport robot drive section 14, is provided, so that a susceptor 1 or shower head 2 which is to be mounted or removed is rested onto the fork 10 of this electrode transport robot 12 in the vacuum, and passed through the opened gate valve 8 either into the process chamber 30 which is in a vacuum condition, or out of the process chamber 30.

Although in FIG. 1 the example shown is that of transport of the susceptor 1, in the case of transport of the shower head 2, this is performed in the same manner, with the shower head 2 being rested onto the fork 10 in the same direction (up/down direction) as mounting inside the process chamber 30.

Next, the electrode exchanging operation in this single-wafer type CVD apparatus will be described, with reference being made to FIG. 1 and FIG. 2. Because the operation of the wafer transport chamber 32 and the operation of processing the semiconductor wafer 3 in the process chamber 30 are the same as in the prior art, this will be omitted from the following description.

In mounting the susceptor 1, first the susceptor 1 is rested onto the fork 10 of the electrode transfer robot 12, and a vacuum is generate in the electrode exchanging chamber 31. When it reaches the same pressure as the process chamber 30, the gate valve 8 is opened. The fork 10 of the electrode transport robot 12 is extended toward the process chamber 30, and the susceptor 1 is carried into the process chamber 30.

Figure 2A:
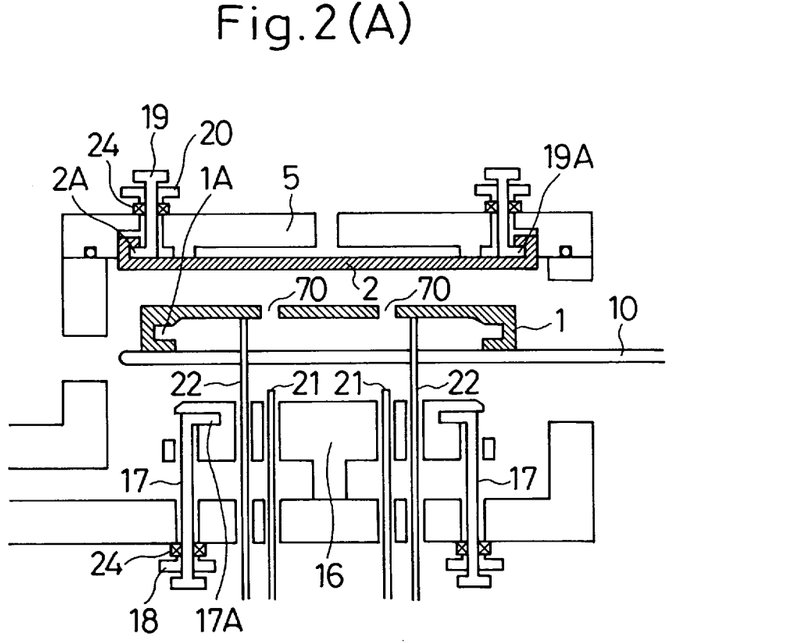
FIG. 2(A) and FIG. 2(B) are drawings which illustrate the exchanging operation of a wafer susceptor shown in FIG. 1.
Figure 2B:
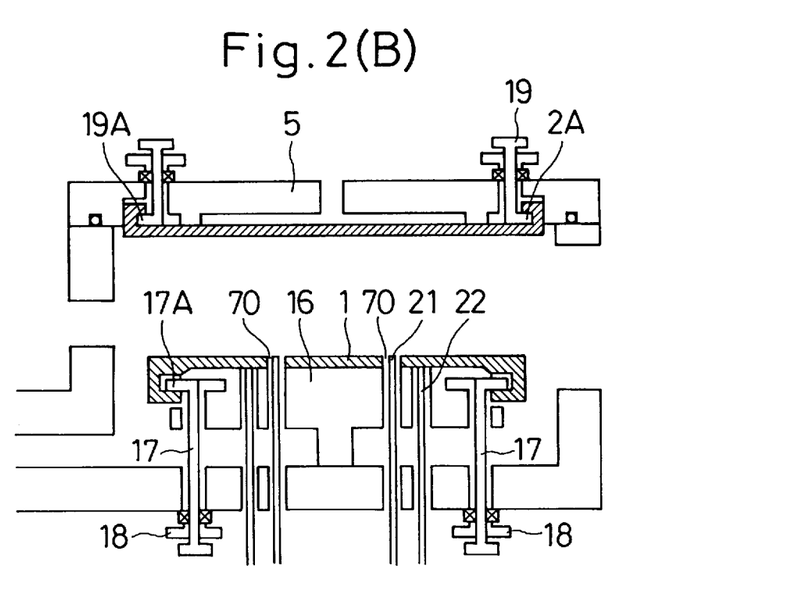

In doing this, the electrode up/down elevator pins 22 are slid upward, and the susceptor 1 being carried thereinto by the electrode transport robot 12, is rested onto the top of the electrode up/down elevator pins 22, as shown in FIG. 2(A).

The fork 10 returns to the electrode exchanging chamber 31, and the gate valve 8 is closed. Then the electrode up/down elevator pins 22 are lowered, thereby resting the susceptor 1 onto the heater block 16.

To hold the susceptor 1 which then rests on the heater block 16 in place, the susceptor clamp 17 is rotated 180 degrees. The top end 17A of the susceptor clamp 17 is shaped as a hook, so that by rotating it 180 degrees it engages the U-shaped formation 1A provided around the peripheral portion of the susceptor 1, in the condition shown in FIG. 2(B). To hold the susceptor with a fixed load, the susceptor clamp tightening handle 18 is rotated, with the rotational angle of the susceptor clamp 17 remaining fixed.

Figure 3A:
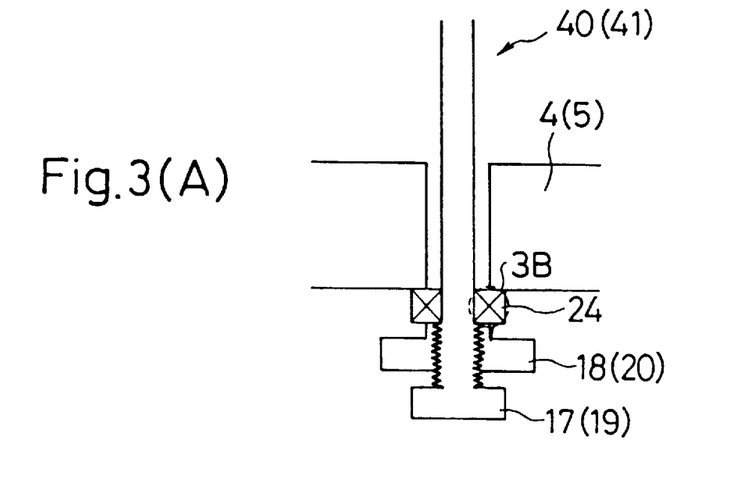
FIG. 3(A) is a cross-sectional view which shows an enlarged view of a clamping mechanism shown FIG. 1
Figure 3B:
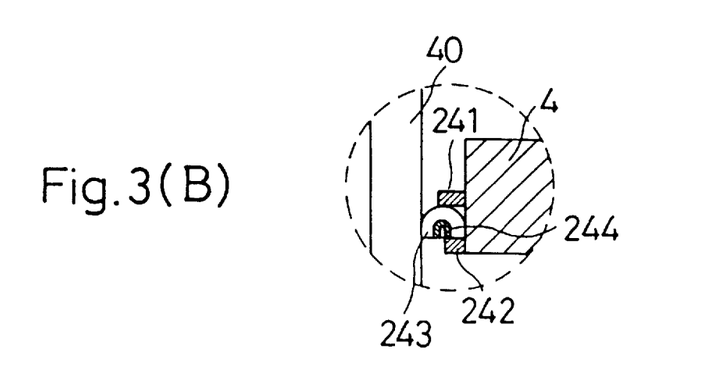
FIG. 3(B) is a an enlarged view of the seal part shown in FIG. 3(A)

As shown in FIG. 3, which shows the susceptor clamping mechanism 40, there is a threaded joint linking the susceptor clamp 17 an the susceptor clamp tightening handle 18. Although the susceptor clamp tightening handle 18 rotates, it does not slide in the up/down direction, while in the case of the susceptor clamp 17, it slides in the up/down direction but does not rotate more than 180 degrees. By rotating the susceptor clamp tightening handle 18, the susceptor clamp 17 is slid downward, so that the susceptor 1 is pressed against the heater block 16. By controlling the ng torque of the susceptor clamp tightening handle 18, the susceptor 1 is brought into contact with the heater block 16 with a constant load.

While the above is the operation for mounting in a vacuum a susceptor 1 that is going to be used, the removal in a vacuum of a susceptor 1 that has been used up until now is performed in the reverse direction of the above operation. A susceptor 1 which has been used up until now and which has been removed can be placed in the electrode exchanging chamber 31 and a susceptor 1 to be used can be mounted in a vacuum. It is also possible to close gate valve 8 and remove a susceptor 1 which has been used up until now to outside the electrode exchanging chamber 31, a vacuum then being generated inside the electrode exchanging chamber 31 into which has been placed a susceptor 1 to be used and the above-noted mounting operation being performed. During the latter series of operations, because the gate valve 8 is in the closed condition, the process chamber 30 is maintained in a vacuum condition.

While FIG. 1 and FIG. 2 show the condition in which a shower head 2 is already mounted, the mounting and removal of a shower head 2 is performed in the same manner as for a susceptor 1, and in FIG. 3, the various locations of the shower head clamping mechanism 41 corresponding to the susceptor clamping mechanism 40 are indicated in parentheses.

In exchanging both the susceptor 1 and the shower head 2, the susceptor 1 is first removed, followed by removal of the shower head 2, mounting of the shower head 2, and finally mounting of the susceptor 1.

When the shower head 2 only is to be exchanged, the susceptor 1 is temporarily removed and placed in the electrode exchanging chamber 31.

When the susceptor 1 only is to be exchanged, the operation can be performed as described above.

Figure 5A:
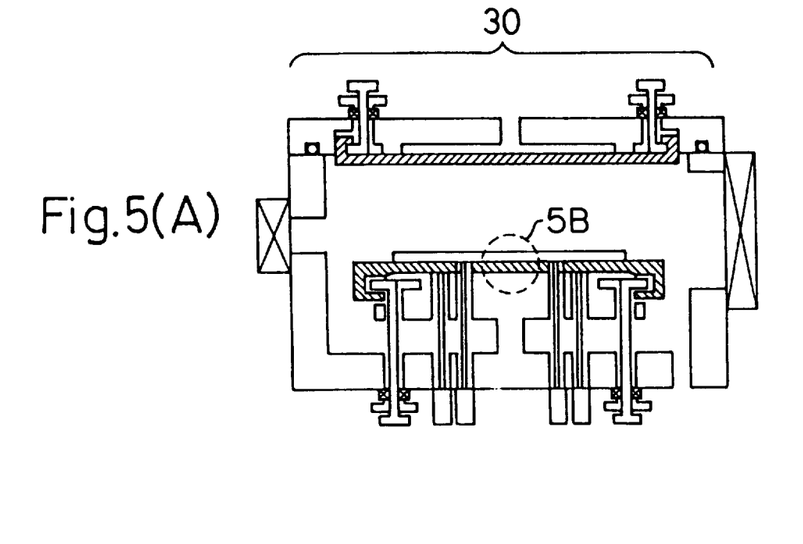
FIG. 5(A) is a cross-sectional view which shows the contact condition between the susceptor of FIG. 4 and a heater block shown in FIG. 1
Figure 5B:
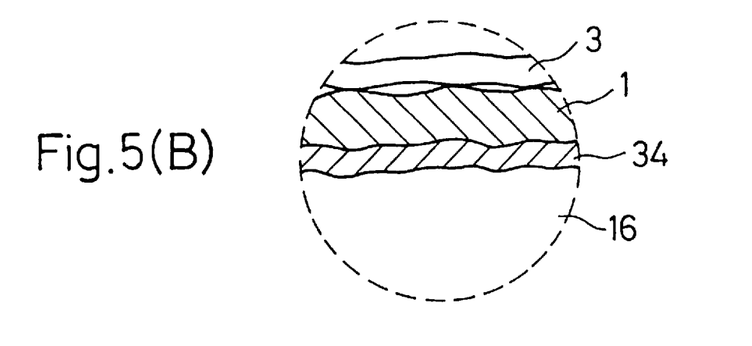
FIG. 5(B) is a partial enlarged cross-sectional view of the contact surface of FIG. 5(A)

When the semiconductor wafer 3 is rested onto the susceptor 1, because of the influence of thermal and other stress, the surface configuration of the susceptor 1 often deforms as shown in FIG. 5(B), making it difficult to perform uniform processing of the semiconductor wafer 3.

Figure 4:
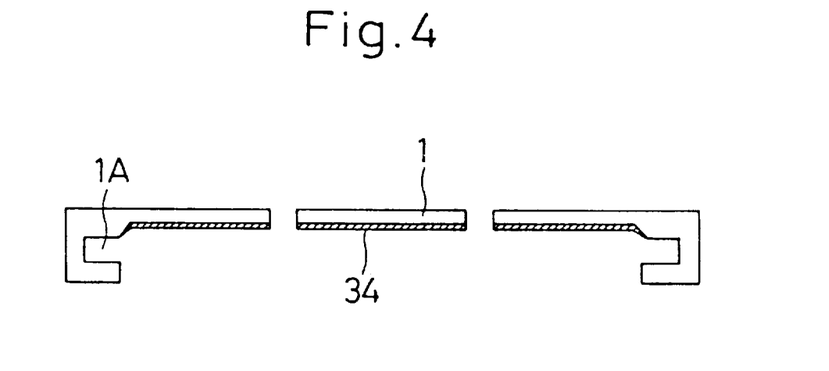
FIG. 4 is a cross-sectional view which shows an improved wafer susceptor.

It is desirable to have a copper sheet 34 mounted to the bottom surface of the susceptor 1, as shown in FIG. 4. Because the copper sheet 34 is softer than the aluminum of which the susceptor 1 and the heater block 16 are made, if susceptor 1 is brought into contact with the heater block 16 with a strong force, the copper sheet 34 deforms into the shape of the heater block 16, as shown in FIG. 5(A), thereby achieving a nearly completely contact with the heater block 16 an minimizing the change in contact surface area compared to the case in which the copper sheet 34 is not used.

Figure 6A:
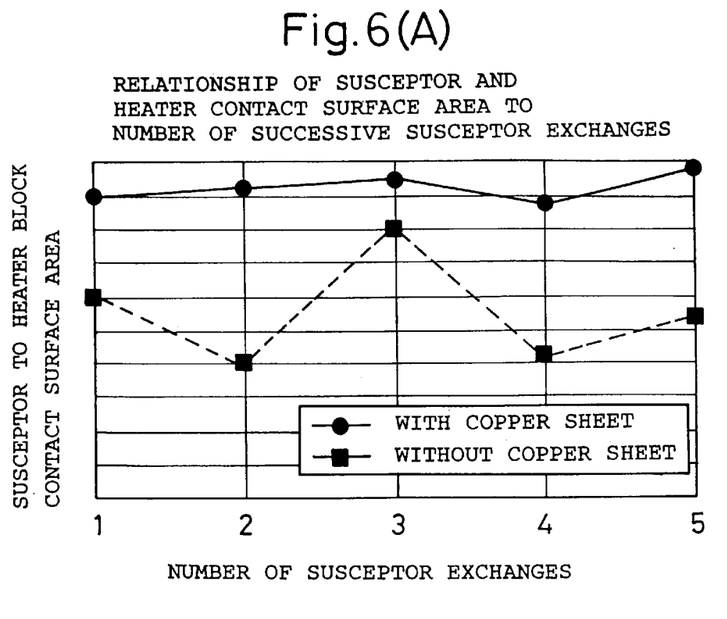
FIG. 6(A) is a graph which shows the relationship between the amount of contact surface area between the susceptor and the heater block with respect to the number of susceptor exchanges made and FIG. 6(B) is a graph which shows the relationship of the susceptor surface temperature to the number of susceptor exchanges.

FIG. 6(A) shows a comparison of the change in contact surface area between the susceptor 1 and the heater block 16 caused by exchanging the susceptor 1, with and without a copper sheet 34. When a copper sheet 34 is mounted to the bottom surface of the susceptor 1, the contact surface area between the susceptor 1 and the heater block 16 is stabilized with respect to the successive exchanging of the susceptor 1.

Figure 6B:
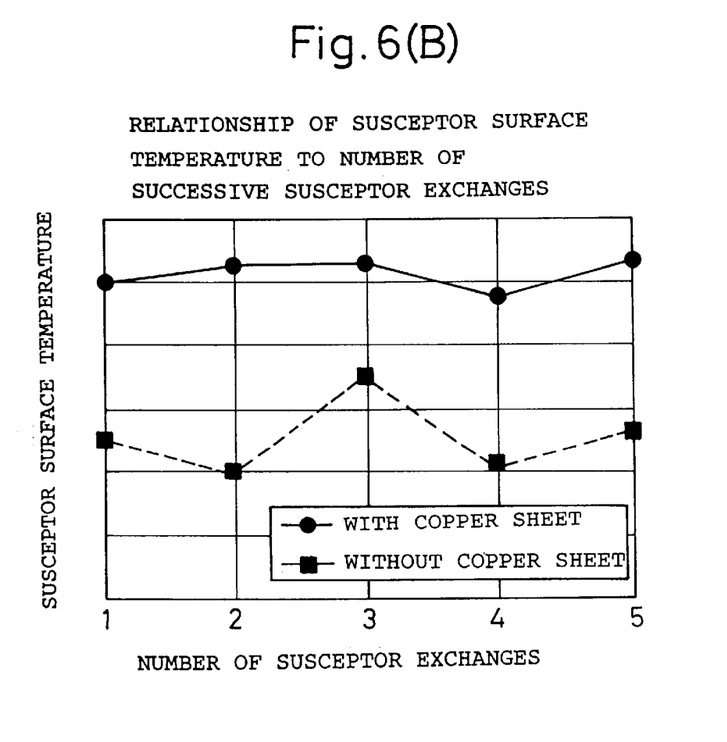

FIG. 6(B) shows a comparison of the change in susceptor surface temperature caused by exchanging the susceptor 1, with and without a copper sheet 34. Similar to the comparison of contact surface area, when a copper sheet 34 is mounted to the bottom surface of the susceptor 1, the surface temperature of the susceptor 1 is stabilized with respect to the successive exchanging of the susceptor 1.

Figure 7:
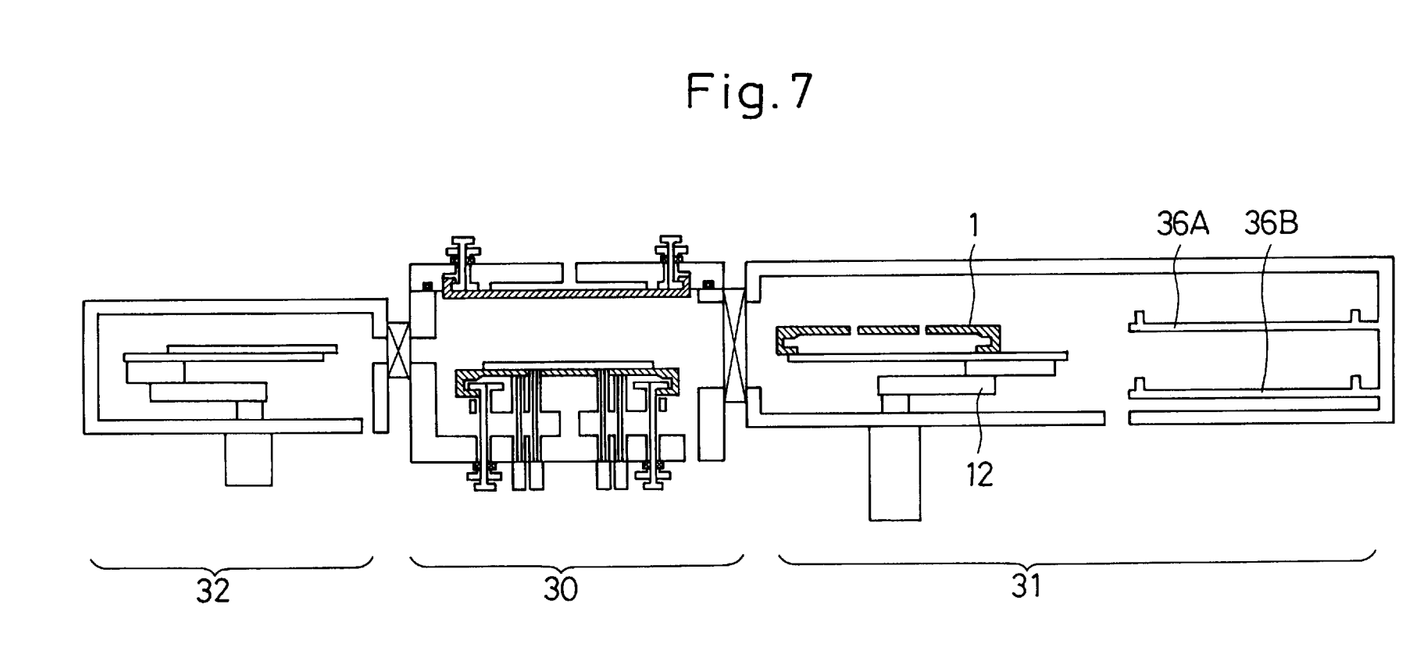
FIG. 7 is a cross-sectional view which shows another embodiment of the present invention.

Turning to FIG. 7, indicative of another embodiment of the present invention, to perform exchanging of an electrode in this single-wafer CVD apparatus in a short period of time, two stages 36 onto which a susceptor or shower head are rested are provided within the electrode exchanging chamber 31.

When exchanging susceptor 1, the susceptor 1 is rested onto one of these stages 36A of the two stages 36, that is, onto the second stage, and a vacuum is then generated within the electrode exchanging chamber 31. The deteriorated susceptor 1 is removed by the same type of operations described with regard to FIG. 1 and FIG. 2 (the opposite of the mounting procedure), and the electrode transport robot 12 rests the susceptor 1 onto the empty stage 36B, that is, onto the first stage and it is carried back to the electrode exchanging chamber 31. To mount the new susceptor 1, the electrode transport robot 12 picks up the susceptor 1 which has just been place onto the stage 36A, and carries it to the process chamber 30, where it is mounted by means of the operations described with regard to FIG. 1 and FIG. 2. Because the operations from the removal to the mounting of the susceptor 1 are carried out without returning the electrode exchanging chamber 31 to atmospheric pressure, it is possible to exchange the susceptor 1 in a short period of time.

It is possible to use stages 36A and 36B also in the same manner in the exchanging of the shower head 2.

It is further desirable to provide two stages 36A and two stages 36B, for the purpose of exchanging both the susceptor 1 and the shower head 2.

Figure 8:
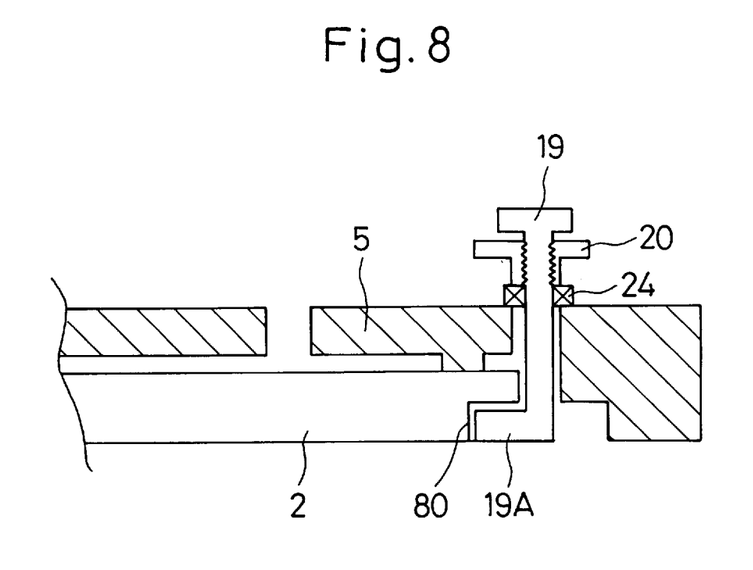
FIG. 8 is a drawing which shows another specific example of a clamping mechanism in the present invention.

FIG. 8 shows another example of the relationship of the above-noted clamping mechanisms 40 and 41 used in the present invention, in relation to the above-noted supporting component 1 or processing component 2.

Specifically, in this example, a mating part 80 which is formed into an L-shape into which the clamp end part 19A of the clamping mechanism 19 is formed around the outer peripheral edge of the above-noted supporting component 1 or processing component 2.

Referring again to FIG. 9, the discription will be made below with respect to the operation of the apparatus 100. Note that FIG. 9 is a plan view in the condition in which the shower head 2 of the process chamber 30 and cover 5 have been removed, and further in the condition in which a semiconductor wafer 3 is mounted onto the susceptor 1, which not only serves as a supporting component 1 but also functions as an electrode.

That is, this shows the condition in which the susceptor 1, a wafer 3 being mounted thereon, is resting on top of the heater block 16, which is provided within the process chamber 30, the up/down elevator pins 22, which can be moved up and down, and which serve as the position adjusting means that can be driven up and down for the purpose of adjusting the horizontal position of the above-noted supporting component 1 or processing component 2 making contact with the susceptor 1, and the U-shaped formation around the outside of the susceptor 1 having engaged into it the clamp end part 17A of the clamping mechanism 17.

The semiconductor wafer mounting region of the above-noted susceptor 1 is provided with apertures 70, through which the up/down elevator pins 21, which are the semiconductor wafer position adjusting means, can pass and move upward and downward.

Now, the fork 11, which is provided in the second hermetically sealed processing space 32, which is the semiconductor wafer 3 transfer chamber, holding the semiconductor wafer 3, proceeds into the processing chamber 30 and moves between the above-noted up/down elevator pins 21 as shown in the drawing, and then places the semiconductor wafer 3 on the semiconductor wafer mounting region 90 of the above-noted susceptor 1, after which it is retracted into the second hermetically sealed processing space 32.

The fork 10, which is provided in the first hermetically sealed processing space 31, which is the electrode exchanging chamber, holds the susceptor 1, proceeds between the above-noted up/down elevator pins 21 as shown in the drawing, and places the susceptor 1 onto the above-noted up/down elevator pins 22, after which it is retracted.

Figure 10:
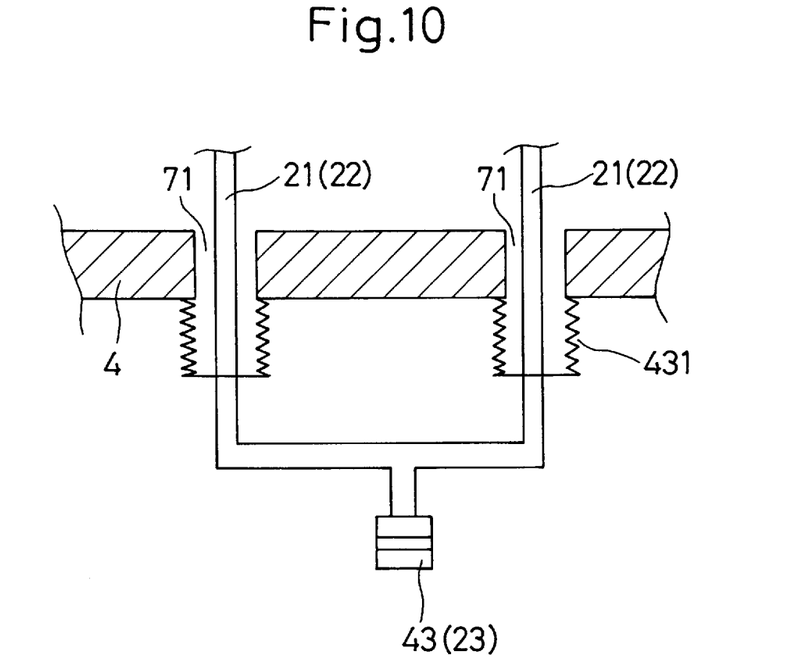
FIG. 10 is a simplified drawing which shows the up/down elevator pin configuration in the present invention.

Next, the connection relationship between the up/down elevator pins, used in the present invention to raise and lower the semiconductor wafer or susceptor 1, and the hermetically sealed process chamber 30 will be described, with reference being made to FIG. 10.

Specifically, the base part of the body 4 of the process chamber 30 has provided in it apertures 71, through which up/down elevator pins 21 or 22 are inserted, these up/down elevator pins 21 or 22 being inserted into the apertures 71 by passing through a metallic bellows 431, in a manner that enables them to move upward and downward. The up/down elevator pins 21 or 22 are moved up and down through the above-noted bellows by a means consisting of an appropriate drive means 43 or 23, such as, for example, an air cylinder, motor, or the like.

A feature of the present invention, is that, as applied to a parallel-plate plasma CVD apparatus having a process chamber for the processing of a semiconductor wafer, a wafer transport chamber adjacent to the above-noted process chamber via a gate valve and in the inside of which can be generated a vacuum so that the above-noted semiconductor wafer can be transported in a vacuum, a wafer transport robot which is positioned inside the above-noted wafer transport chamber and which transports the above-noted semiconductor wafer from the above-noted wafer transport chamber to the above-noted process chamber, a bottom electrode susceptor onto which the above-noted semiconductor wafer is rested inside the above-noted process chamber, a heater block which makes contact with the above-noted susceptor and heats the above-noted semiconductor wafer via this susceptor, and a top electrode, i.e., a shower head which disperses fed gas over the above-noted semiconductor wafer, it is a single-wafer type plasma CVD apparatus which, in order to enable exchange of the above-noted susceptor, the above-noted shower head, or both the above-noted susceptor and above-noted shower head, has an electrode exchanging chamber adjacent to the above-noted process chamber via a gate valve and in the inside of which can be generated a vacuum, an electrode transport robot which is positioned inside the above-noted electrode exchanging chamber and which transports the above-noted susceptor or above-noted shower head from the above-noted exchanging chamber to the above-noted process chamber, an electrode up/down elevator pin which transports the above-noted susceptor or above-noted shower head to a prescribed height, and a clamping mechanism which holds the above-noted susceptor or above-noted shower head from outside the above-noted process chamber with a prescribed torque. It is desirable in this arrangement to mount a copper sheet to the surface thereof which makes contact with the above-noted heat block. It is possible inside the above-noted electrode exchanging chamber to have a first stage onto which is rested a susceptor or a shower head that has been used up to now, and a second stage onto which is rested a susceptor or a shower head that is going to be used. In addition, it is possible to have a U-shaped formation in the periphery of the side of the above-noted susceptor that makes contact with the heater block, and to have a protrusion of the above-noted clamping mechanism fit thereinto, these being located outside the above-noted process chamber. It is possible for the susceptor to make pressurized contact with the above-noted heater block via the above-noted protrusion. It is alternately possible to have U-shaped formations around the side of the above-noted shower head facing the semiconductor wafer and around the opposite side, the above-noted protrusion of the clamping mechanism fitting therein, torque applied outside the process chamber causing the shower head to make a pressurized contact with the outside wall of the process chamber, via the above-noted protrusion.

In the present invention as described above, because an electrode exchanging chamber which is adjacent to the process chamber via a gate valve and inside which a vacuum can be generated is provided, it is possible to transport a susceptor or a shower head in a vacuum, and further because an electrode up/down elevator pin, which transports a susceptor or a shower head to a prescribed height, and a clamping mechanism by which a susceptor or a shower head is held by a prescribed torque applied from outside the process chamber are provided, it is possible to perform removal and pressurized holding of a susceptor or a shower head in a vacuum.

In the present invention as described above, because an electrode exchanging chamber which is adjacent to the process chamber via a gate valve and inside which a vacuum can be generated is provided, it is possible to transport a susceptor or a shower head in a vacuum, and additionally because an electrode up/down elevator pin, which transports a susceptor or a shower head to a prescribed height, and a clamping mechanism by which a susceptor or a shower head is held by a prescribed torque applied from outside the process chamber are provided, it is possible to perform removal and pressurized holding of a susceptor or a shower head in a vacuum. Therefore, it is possible to exchange a susceptor while limiting the change in the surface temperature thereof or to hold a shower head at the top part, without the occurrence of a problem with residual gas caused by oxygen or moisture components in the air, without a problem of the generation of particles, and without the problem of generated materials flaking from the inside wall of the chamber. Also, by mounting a copper sheet to the surface of the aluminum susceptor which makes contact with the aluminum heater block, it is possible to further limit the change in surface temperature of the susceptor.

What is claimed is:

1. A semiconductor manufacturing apparatus which performs processing of a semiconductor wafer in a hermetically sealed processing space, said hermetically sealed space including a processing component fixedly clamped thereto and a supporting component also fixedly clamped thereto, said semiconductor manufacturing apparatus comprising:

a replacement processing or supporting component storage and transport in/out mechanism to store at least one of a supporting component and a processing component, and transport said replacement processing or supporting component into said hermetically sealed processing space and remove from said hermetically sealed processing space a replaced processing or supporting component without disturbing the hermetically sealed condition of said hermetically sealed processing space; and a clamping mechanism in said hermetically sealed processing space which, responsive to operations from outside said hermetically sealed processing space, either holds said supporting component or said processing component in a position within said hermetically sealed processing space or releases the hold thereon at a position, without disturbing said hermetically sealed condition inside said hermetically sealed processing space.

2. The apparatus according to claim 1, wherein said replacement processing or supporting component transport in/out mechanism is provided inside a first adjacent space, which is provided adjacent to said hermetically sealed processing space and which can be maintained in a hermetically sealed condition, said replacement processing or supporting component transport in/out mechanism being configured as a robot mechanism which when said hermetically sealed processing space and said first adjacent space are communicated to each other and are in the hermetically sealed condition, transports said supporting component or said processing component which performs processing of said semiconductor wafer between said hermetically sealed processing space and said first adjacent space.

3. The apparatus according to claim 2, wherein a first stage for holding an already used supporting component or an already used processing component, and a second stage for holding a support component or a processing component which is going to be used are provided inside said first adjacent space.

4. A semiconductor manufacturing apparatus which performs processing of a semiconductor wafer in a hermetically sealed processing space, said hermetically sealed space including a processing component fixedly clamped thereto and a supporting component also fixedly clamped thereto, said semiconductor manufacturing apparatus comprising:

a replacement processing or supporting component storage and transport in/out mechanism to store at least one of a supporting component and a processing component, and transport said replacement processing or supporting component into said hermetically sealed processing space and remove from said hermetically sealed processing space a replaced processing or supporting component without disturbing the hermetically sealed condition of said hermetically sealed processing space; and a position adjusting means in said hermetically sealed processing space that can be driven upward and downward for the purpose of adjusting, responsive to operations from outside said hermetically sealed processing space, the horizontal position of said supporting component or said processing component without disturbing the hermetically sealed condition inside said hermetically sealed processing space.

5. The apparatus according to claim 4, further comprising a semiconductor wafer position adjusting means that can be driven upward and downward for adjusting the horizontal position of said semiconductor wafer.

6. The apparatus according to claim 4, wherein said replacement processing or supporting component transport in/out mechanism is provided inside a first adjacent space, which is provided adjacent to said hermetically sealed processing space and which can be maintained in a hermetically sealed condition, said replacement processing or supporting component transport in/out mechanism being configured as a robot mechanism which when said hermetically sealed processing space and said first adjacent space are communicated to each other and are in the hermetically sealed condition, transports said supporting component or said processing component which performs processing of said semiconductor wafer between said hermetically sealed processing space and said first adjacent space.

7. A semiconductor manufacturing apparatus which performs processing of a semiconductor wafer in a hermetically sealed processing space, said hermetically sealed space including a processing component fixedly clamped thereto and a supporting component also fixedly clamped thereto, said semiconductor manufacturing apparatus comprising:

a replacement processing or supporting component storage and transport in/out mechanism to store at least one of a supporting component and a processing component, and transport said replacement processing or supporting component into said hermetically sealed processing space and remove from said hermetically sealed processing space a replaced processing or supporting component without disturbing the hermetically sealed condition of said hermetically sealed processing space; and a clamping mechanism in said hermetically sealed processing space which, responsive to operations from outside said hermetically sealed processing space, either holds said supporting component or said processing component in a position within said hermetically sealed processing space or releases the hold thereon at a position, without disturbing said hermetically sealed condition inside said hermetically sealed processing space; and a position adjusting means in said hermetically sealed processing space that can be driven upward and downward for the purpose of adjusting, responsive to operations from outside said hermetically sealed processing space, the horizontal position of said supporting component or said processing component without disturbing the hermetically sealed condition inside said hermetically sealed processing space.

8. The apparatus according to claim 7, further comprising a semiconductor wafer position adjusting means that can be driven upward and downward for adjusting the horizontal position of said semiconductor wafer.

9. The apparatus according to claim 7, wherein said replacement processing or supporting component transport in/out mechanism is provided inside a first adjacent space, which is provided adjacent to said hermetically sealed processing space and which can be maintained in a hermetically sealed condition, said replacement processing or supporting component transport in/out mechanism being configured as a robot mechanism which when said hermetically sealed processing space and said first adjacent space are communicated to each other and are in the hermetically sealed condition, transports said supporting component or said processing component which performs processing of said semiconductor wafer between said hermetically sealed processing space and said first adjacent space.

10. The apparatus according to claim 9, wherein a first stage for holding said an already used supporting component or an already used processing component, and a second stage for holding a support component or a processing component which is going to be used are provided inside said first adjacent space.

11. A semiconductor manufacturing apparatus comprising:

a process chamber;

a wafer transport chamber coupled to said process chamber to transfer a wafer into said process chamber; and an exchanging chamber coupled to said process chamber to transfer a replacement component into said process chamber, wherein said replacement component comprises at least one of a process component and a supporting component.

12. The apparatus claimed in claim 11, wherein said process chamber including a wafer transport up/down elevator pin for rising or lowering said wafer, a component up/down elevator pin for moving said replacement component, and a clamp system for clamping said replacement component, said wafer transport up/down elevator pin, said component up/down elevator pin, and said clamping system being driven independent of each other.

13. The apparatus claimed in claim 12, wherein said clamp system comprises a clamp pin having a protrusion for holding said replacement component operated from outside of said process chamber through a hole formed at a bottom portion of said process chamber.

14. The apparatus claimed in claim 13, wherein said clamp system comprises a component tightening handle to hold said replacement component by a load after said clamp pin holds said replacement component.

15. The apparatus claimed in claim 14, wherein said replacement component having an U-shaped formation around a peripheral portion thereof, to insert said protrusion into said U-shaped formation.

16. The apparatus claimed in claim 13, wherein said clamp system comprises a component tightening handle to hold said replacement component with a load, after said protrusion is inserted into said U-shaped formation, said replacement component is pressed against said heater block by said component tightening handle being rotated.

17. The apparatus claimed in claim 12, wherein said clamp system comprises a clamp pin having a protrusion for holding said replacement component operated from outside of said process chamber through a hole formed at a top portion of said process chamber.

18. The apparatus claimed in claim 17, wherein said clamp system comprises an component tightening handle to hold said replacement component with a load after said clamp pin holds said replacement component.

19. The apparatus claimed in claim 17, wherein said replacement component having an U-shaped formation around a peripheral portion thereof, to insert said protrusion into said U-shaped formation.

20. The apparatus claimed in claim 17, wherein said clamp system comprises a component tightening handle to hold said replacement component with a load, after said protrusion is inserted into said U-shaped formation, said replacement component is pressed against said top portion of said processing chamber by that said component tightening handle is rotated.

21. The apparatus claimed in claim 11, wherein said process chamber comprises a heater block coupled to a bottom inside of said process chamber and having at least one hole; said wafer transport up/down elevator pin and said component up/down elevator pin are operated from outside of said process chamber through said holes of said heater block.

22. The apparatus claimed in claim 21, wherein a copper sheet is installed between said heater block and said replacement component.

23. The apparatus claimed in claim 11, wherein said replacement component has a L-shaped portion around a peripheral portion thereof, said apparatus further including a clamp system comprising a clamp pin having a protrusion for mating with said L-shaped portion of said replacement component to hold said replacement component and a component tightening handle to hold said replacement component by a load after said clamp pin holds said replacement component.

24. A semiconductor manufacturing apparatus comprising:
a first chamber for processing a wafer and including a wafer transport up/down elevator pin for rising or lowering said wafer, an electrode up/down elevator pin for moving an electrode, and a clamp system for clamping said electrode; and
a second chamber coupled to said first chamber to transfer said electrode into said first chamber and take out said electrode from said first chamber.

25. The apparatus claimed in claim 24, further including means for independently moving each of said wafer transport up/down elevator pin and said electrode up/down elevator pin.

26. The apparatus claimed in claim 24, wherein said first chamber comprises a heater block coupled to a bottom inside of said process chamber and having at least one hole; said wafer transport up/down elevator pin and said electrode up/down elevator pin are operated from outside of said process chamber through said hole of said heater block.

27. The apparatus claimed in claim 26, wherein said clamp system comprises a clamp pin having a protrusion for holding said electrode operated from outside of said process chamber through a hole formed at a bottom portion of said process chamber.

28. The apparatus claimed in claim 27, wherein said clamp system comprises an electrode tightening handle to hold said electrode by a load after said clamp pin holds said electrode.

29. The apparatus claimed in claim 28, wherein said electrode having an U-shaped formation around a peripheral portion thereof, said protrusion is inserted into said U-shaped formation.

30. The apparatus claimed in claim 29, wherein said clamp system comprises an electrode tightening handle to hold said electrode with a load, after said protrusion is inserted into said U-shaped formation, said electrode is pressed against said heater block by said electrode tightening handle being rotated.

31. The apparatus claimed in claim 24, wherein said clamp system comprises a clamp pin having a protrusion for holding said electrode operated from outside of said process chamber through a hole formed at a top portion of said process chamber.

32. The apparatus claimed in claim 31, wherein said clamp system comprises an electrode tightening handle to hold said electrode with a load after said clamp pin holds said electrode.

33. The apparatus claimed in claim 31, wherein said electrode having an U-shaped formation around a peripheral portion thereof, to insert said protrusion into said U-shaped formation.

34. The apparatus claimed in claim 33, wherein said clamp system comprises another electrode tightening handle to hold said electrode with a load, after said protrusion is inserted into said U-shaped formation, said electrode is pressed against said top portion of said processing chamber by said electrode tightening handle being rotated.

35. The apparatus claimed in claim 31, wherein said electrode has a L-shaped portion around a peripheral portion thereof, said clamp system comprises another clamp pin having a protrusion for mating with said L-shaped portion of said electrode to hold said electrode and an electrode tightening handle to hold said electrode by a load after said another clamp pin holds said electrode.

36. The apparatus claimed in claim 24, wherein a copper sheet is installed between said heater block and said electrode.

* * * * *